US005754118A

United States Patent [19]

Brunner

[11] Patent Number: 5,754,118

[45] Date of Patent: May 19, 1998

[54] INTERNALLY REDUNDANT MICROWAVE SWITCH MATRIX

[75] Inventor: Robert A. Brunner, Redondo Beach, Calif.

[73] Assignee: Hughes Electronics Corporation, El Segundo, Calif.

[21] Appl. No.: 621,608

[22] Filed: Mar. 25, 1996

[51] Int. Cl.[6] .......... H04Q 19/00; H03K 17/80; H11C 13/02; G01R 31/08

[52] U.S. Cl. .......... 340/825.79; 307/401; 307/415; 370/217

[58] Field of Search .......... 340/825.79, 826, 340/827, 825.16, 825.01; 307/401, 415, 98; 365/129; 370/217, 354, 218, 380, 360, 219, 220; 379/271, 272, 273, 291, 306, 335

[56] References Cited

U.S. PATENT DOCUMENTS

| | | | |
|---|---|---|---|
| 4,683,564 | 7/1987 | Young et al. | 340/825.79 |
| 4,737,951 | 4/1988 | Kruger et al. | 370/58 |
| 4,931,802 | 6/1990 | Assal et al. . | |
| 4,978,953 | 12/1990 | Hauge | 340/825.16 |
| 5,198,808 | 3/1993 | Kudo | 340/825.8 |

*Primary Examiner*—Michael Horabik
*Assistant Examiner*—Anthony A. Asongwed
*Attorney, Agent, or Firm*—Elizabeth E. Leitereg; Terje Gudmestad; Michael W. Sales

[57] ABSTRACT

A switch matrix having internal redundancy by combining outputs of two internal channels to form one single internally redundant channel. 1 by N, M by 1 and M by N switch matrices may be constructed using the principles of the present invention. Each input signal line is coupled between a signal input and a terminating resistor and each output signal line is coupled between a signal output and a terminating resistor. Switching nodes are formed that comprise an input line, a plurality of output lines, and a plurality of pairs of couplers that are respectively interconnected by way of respective switches used to select the input line and couple it to a respective output line. Pairs of output signal lines are connected to a single signal output to form internally redundant channels. The nodes may include a second serially coupled switch connected between the input and output couplers to provide redundancy if either one of the switches fail in a closed state. Amplifiers may optionally be disposed in each of the output signal lines.

9 Claims, 3 Drawing Sheets

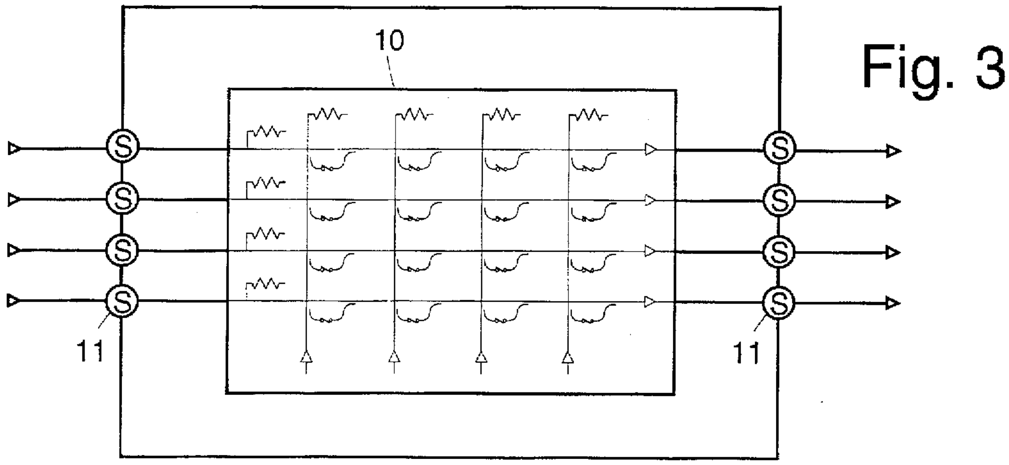
Fig. 3
Fig. 5
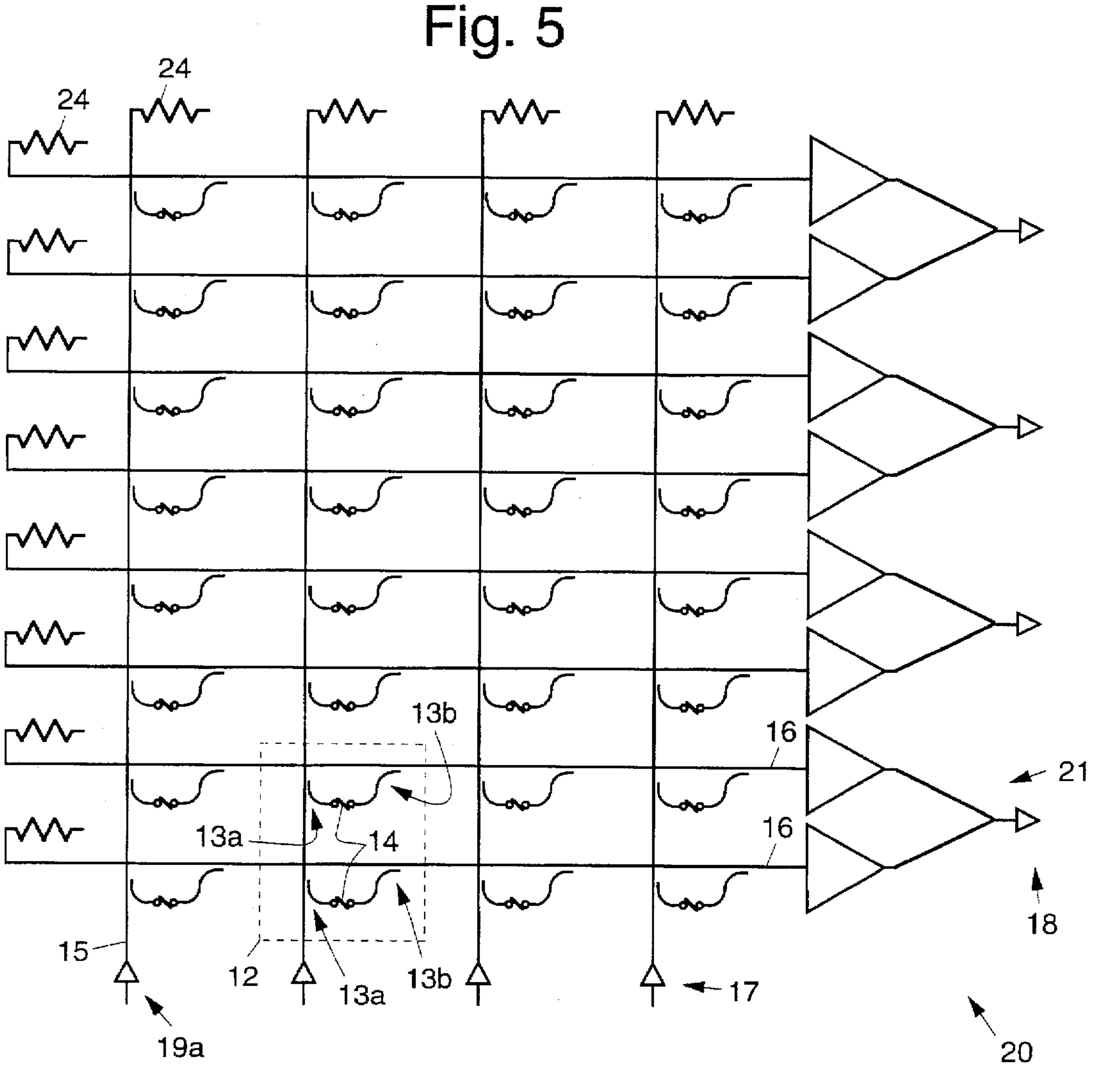

INTERNALLY REDUNDANT MICROWAVE SWITCH MATRIX

BACKGROUND

The present invention relates generally to microwave switch matrices, and more particularly, to redundant microwave switch matrices.

The prior art relating to the present invention is in the form of three types of switch matrices. The first switch matrix is a simple cross bar matrix having no redundancy. The second switch matrix uses a cross bar matrix as a primary matrix and another identical cross bar matrix for redundant use. Electro-mechanical switches or passive hybrids provide signal routing to the unfailed matrix in case of a failure in the primary matrix. The third switch matrix uses a ring-around scheme that bypasses the switch matrix in a failure mode. These prior art switch matrices require twice the hardware, electronics, and electro-mechanical switches or passive hybrids to provide the redundancy performance of the present invention. This additional hardware more than doubles the cost of the conventional switch matrices and requires more volume, weight and power.

Providing redundancy within highly reliable systems insures reliability beyond failure rates of components used therein. Systems utilizing active switch matrices for channel routing and switching rely on separate redundant units to provide system redundancy and enhanced reliability.

Active switch matrix redundancy is typically required for high reliability systems (such as signal processing and digital and analog communications systems) that use switch matrices. Most space communications satellites use electro-mechanical switching schemes because it is believed that active switches do not provide the redundancy needed in a failure mode. If a electro-mechanical switch fails it usually fails in a useable position thus eliminating the need for a redundant switch. Active switches, however, could fail in a position resulting in excess or complete signal loss. This concern has forced complex unit redundancy schemes.

Previously-used redundancy schemes using an active switch matrix is done in one of two ways. The first way is to use two separate and isolated switch matrix units that use electro-mechanical switches of active switches to provide redundant unit selection in case of a failure. The second is a ring of electro-mechanical switches of active switches that can bypass the matrix in a failure mode. Both approaches require additional switches, extra RF hardware and control circuitry.

Accordingly, it is an objective of the present invention to provide for internally redundant microwave switch matrices that provides for redundant fail-safe operation and that reduces the amount of required hardware, eliminating additional power, volume, mass and complexity.

SUMMARY OF THE INVENTION

To meet the above and other objectives, the present invention provides for an internal approach to make a redundant switch matrix without requiring two independent matrices as is typically done in the prior art. The present approach provides for pairs of output signal lines of the switch matrix that are combined at the outputs thereof, thus providing a primary and redundant internal paths that may be used during normal operation or in a failure mode. This approach reduces the amount of hardware required, and eliminates additional power, volume, mass and complexity. The present invention also may employ pairs of switches coupled between the input and output couplers to provide redundancy if either one of the switches fail in a closed state.

More particularly, in the present switch matrix, each input signal line is coupled between a signal input and a terminating resistor and each output signal line is coupled between a signal output and a terminating resistor. Switching nodes are formed that comprise an input line, a plurality of output lines, and a plurality of pairs of couplers that are interconnected by way of respective switches used to select the input line and couple it to a respective output line. Pairs of output signal lines are connected to a single signal output to form internally redundant channels. The nodes may include a second serially coupled switch connected between the input and output couplers to provide redundancy if either one of the switches fail in a closed state. Amplifiers may optionally be disposed in each of the output signal lines. 1by N, M by 1 and M by N switch matrices may be constructed using the principles of the present invention.

The present approach has internal redundancy by combining outputs of two internal channels to form one single internally redundant channel. This allows one or more switch and/or amplifier (if any) failures without losing a channel within the matrix. This eliminates the need for a redundant matrices and/or electro-mechanical switches to provide a bypass in a failure mode. The result is a fully internally redundant matrix that is lighter, less expensive and less complex than conventional redundant active and electro-mechanical matrices. The present approach also allows for multiple failures within the matrix while maintaining full capability.

Because it is lighter, smaller and less expensive, the present invention may be employed to eliminate the use of electro-mechanical switches for the redundancy switching scheme on communications repeaters and eliminate or reduce electro-mechanical switches used on satellite systems. Because of the internal redundancy, concerns over active switch matrix reliability should be eliminated, resulting in a lighter, cheaper and more configurable payload.

The electro-mechanical switch implementation is costly, heavy and requires complex control logic circuitry with unusual voltage and current levels for switching. The present internally redundant switch matrix can use simple CMOS control logic that is easily designed into an ASIC, as well as low voltage and current levels, reducing the strain on the power subsystem. This approach is far lighter by comparison to conventional schemes and permits a much simpler spacecraft layout and integration because of the elimination of multiple waveguide, cable and harness connections.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 3 shows a conventional switch matrix with redundancy bypass switches;

FIG. 5 illustrates an internally redundant 4 by 4 matrix with amplifiers in accordance with the principles of the present invention.

DETAILED DESCRIPTION

Figure 1:
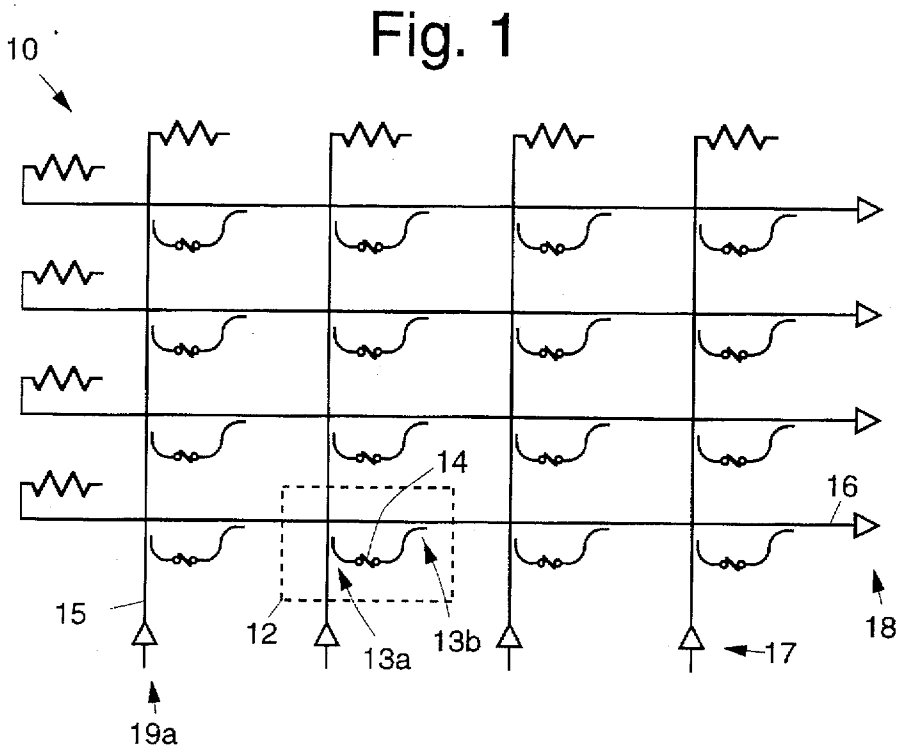
FIG. 1 shows a conventional 4×4 matrix without redundancy.
Figure 2:
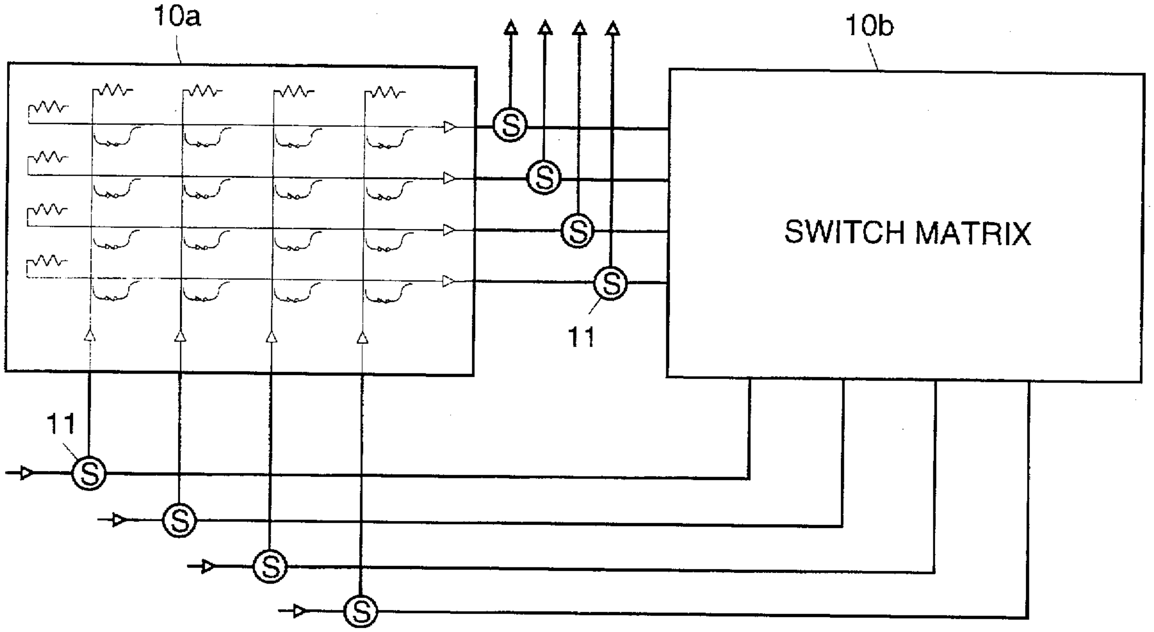
FIG. 2 shows conventional dual matrices with redundant switching.

Referring to the drawing figures, FIGS. 1–3 illustrate conventional switch matrices 10 that are improved upon by the present invention. FIGS. 1–3 show three types of switch matrices 10. FIG. 1 shows a simple cross bar matrix 10 with no redundancy. FIG. 2 uses a cross bar switch matrix 10 as a primary matrix 10a and another identical cross bar switch matrix 10b for redundant use. Electro-mechanical switches 11 or passive hybrids 11 provide signal routing to an unfailed switch matrix 10a, 10b in case of a failure. FIG. 3 shows a ring-around scheme that bypasses the switch matrix 10 in a failure mode. The prior art schemes of FIGS. 1–3 require unnecessary hardware, electronics and electro-mechanical switches 11 or passive hybrids 11 to provide redundancy performance when compared to the present invention that will be described below. This results in switch matrices 10 that have relatively high cost and require unnecessary volume, weight and power.

The present invention is easiest to describe when implemented using a cross-bar switch matrix architecture. However, it is to be understood that the present invention may also be implemented in all other switch and switch matrix architectures. A cross-bar switch matrix architecture is also chosen because it can be simply implemented using microstrip technology, thus making the addition of dual output lines simple and small. Consequently, the present discussion will be limited to a description the cross-bar architecture, but the scope of the present invention covers all forms of switch matrix architectures as well as all n by m or n by n combinations of inputs and outputs.

Referring again to FIG. 1, using the conventional 4 by 4 switch matrix 10 for illustrative purposes, its inputs 17 are all passive and there are no active components that can fail. Each node 12 of the switch matrix 10 has input and output couplers 13a, 13b interconnected by way of a switch 14 that are used to select an input line 15 and connect it to an output line 16, and which coupled the selected input 17 to the selected output 18. Switching the switch 14 in any node 12 into an "on" position allows an input signal to couple onto the switched output line 16. If the switch 14 fails, the input signal cannot couple onto the output line 16 at the desired signal strength. Likewise, if there are amplifiers in the input or the output signal lines 15, 16, their failure could result in loss of a input or output channel 19a, 19b that includes all nodes disposed along a corresponding input or output line 15, 16.

Figure 4:
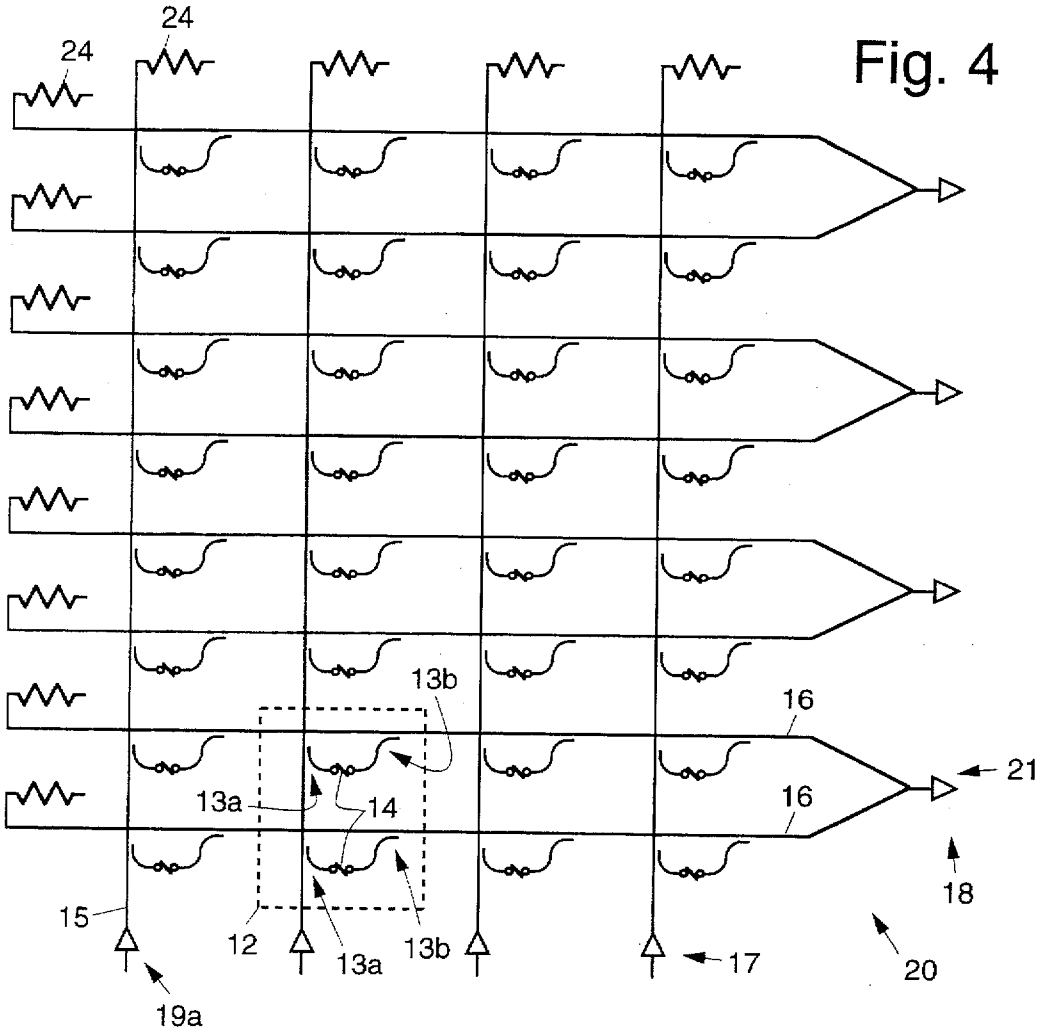
FIGS. 4, AND 4*a* illustrate a 4 by 4 internally redundant switch matrix in accordance with the principles of the present invention.

Now referring to FIG. 4, it illustrates a 4 by 4 internally redundant switch matrix 20 in accordance with the principles of the present invention. Combining outputs 18 from pairs of output signal lines 16 as shown in FIG. 4, results in a fully internally redundant matrix 20 that can have several switch failures without the loss of a node 12 and/or channel 21. Each node 12 of the present switch matrix 20 includes one input line 15, two output lines 16, and two pairs of input and output couplers 13a, 13b interconnected by way of a switch 14 that are used to select an input line 15 and connect it to a respective one of the output lines 16. Thus, pairs of output signal lines 16 of the switch matrix 20 are combined at their outputs 18, providing primary and redundant internal paths that may be used during normal operation or in a failure mode. Control lines (not shown) for the switches 14 that share the same input and output node 12 can be controlled together or separately, providing flexibility in failure mode handling. This scheme allows the addition of amplifiers 22 in each of the output signal lines 16 to provide lower loss or gain to the switch matrix 20 without putting a single point failure in any channel 21, as shown in FIG. 5.

Figure 4A:
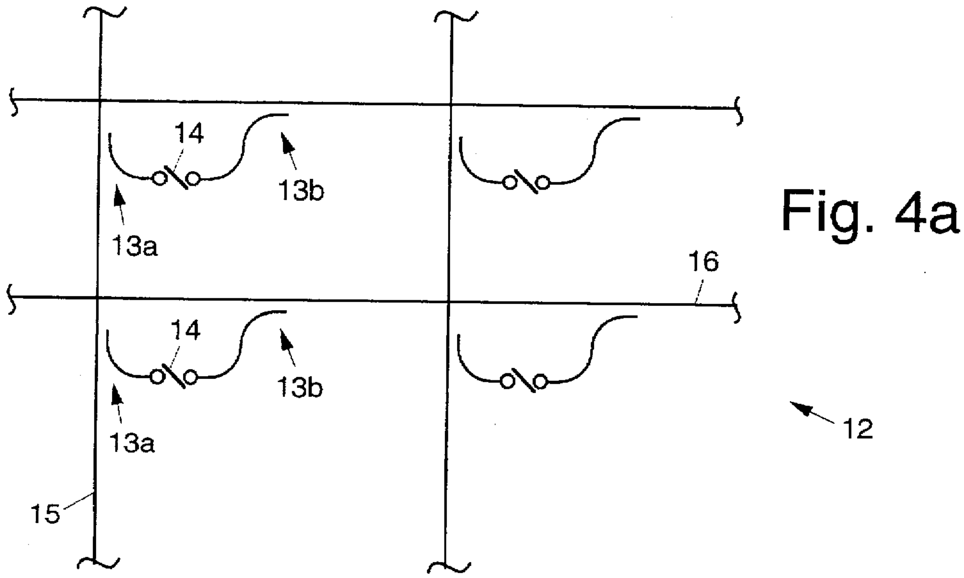

Furthermore, as an option, and with reference to FIG. 4a, the nodes 12 of the switch matrix 20 may incorporate a second switch 14a connected in series with the other switch 14 between the input and output couplers 13a, 13b. The pairs of switches 14, 14a provide redundancy if either one of the switches 14, 14a fail in a closed state.

Referring to FIG. 5, it illustrates an internally redundant 4 by 4 matrix in accordance with the principles of the present invention that includes amplifiers 22 in the output lines 18. By combining outputs 18 of pairs of output lines 16 to form a channel 21 as shown in FIG. 5, a redundancy scheme is achieved that is similar to the scheme shown in FIG. 4. If amplifiers (not shown) need to be added to this architecture, they can be distributed in one of two ways. Amplifiers may be put on each input arm after a power divider (not shown) used in the input signal path or if a lower noise figure is required, a hybrid amplifier (not shown) may be inserted in the front of the matrix 20.

Redundant power supplies and control circuitry may be required with the switch matrices 20 shown in FIGS. 4 and 5. These components need to be isolated to protect the redundant switch matrices 20 from being damaged by a component failure or input fault. A key advantage to the present internally redundant matrix 20 is that the redundant isolation requirement for control circuitry to the switches 14 can simply be provided with resistors 24. GaAs MMIC switches 14, for example, require very low current, and therefore resistor isolation is sufficient. In contrast, isolation with conventional electro-mechanical switches must be provided with relays. Combining the outputs 18 of the switch matrix 20 is easily realizable with Lange or Wilkenson microstrip couplers 13a, 13b, for example, which eliminates costly and bulky coaxial or waveguide connections to and from mechanical switches.

The DC current and voltages required for the present invention are very low (usually <5 VDC) allowing low power control logic and power supplies for switching. Conventional switch matrices 10 that use electro-mechanical switches require high voltages and current to switch the mechanical rotor. These high currents and voltages create "spikes" in the power subsystem of a spacecraft, for example, and require careful shielding. Voltage or current transients created during switching may be passed into sensitive spacecraft components resulting in component failure or anomalous performance. The present invention simplifies the EMI design of a spacecraft and may help eliminate bulky shielding and filter feedthroughs required therein.

The above-described invention has been discussed with reference to the construction of 4 by 4 switch matrices 20. However, it is to be understood that switch matrices 20 having other numbers of inputs and outputs are also contemplated by the present invention. In particular, 1 by N, M by 1 and M by N switch matrices 20 may also be constructed using the above-described principles of the present invention.

Thus, internally redundant microwave switch matrices that provides for redundant fail-safe operation have been disclosed. It is to be understood that the described embodiment is merely illustrative of some of the many specific embodiments which represent applications of the principles of the present invention. Clearly, numerous and varied other arrangements may be readily devised by those skilled in the art without departing from the scope of the invention.

What is claimed is:

1. An internally redundant microwave switch matrix that provides for redundant fail-safe operation comprising:

a plurality of signal inputs;

a signal output;

a plurality of input signal lines respectively coupled between the plurality of signal inputs and a plurality of terminating resistors;

a plurality of output signal lines respectively coupled between the signal output and a plurality of terminating resistors;

a plurality of nodes wherein each node comprises an input line and a plurality of output lines, and a plurality of pairs of couplers that are respectively interconnected by way of respective switches that are used to select an input line and couple it to a respective output line;

and wherein pairs of output signal lines are connected to a single signal output.

2. The matrix of claim 1 wherein the nodes further comprise a second serially coupled switch connected between the input and output couplers to provide redundancy if either one of the switches fail in a closed state.

3. The matrix of claim 1 further comprising an amplifier disposed in each of the output signal lines.

4. An internally redundant microwave switch matrix that provides for redundant fail-safe operation comprising:

a signal input;

a plurality of signal outputs;

an input signal line coupled between the signal input and a terminating resistor;

a plurality of output signal lines respectively coupled between the plurality of signal outputs and a plurality of terminating resistors;

a plurality of nodes wherein each node comprises the input line and a plurality of output lines, and a plurality of pairs of couplers that are respectively interconnected by way of respective switches that are used to select the input line and couple it to a respective output line;

and wherein pairs of output signal lines are connected to a single signal output.

5. The matrix of claim 4 wherein the nodes further comprise a second serially coupled switch connected between the input and output couplers to provide redundancy if either one of the switches fail in a closed state.

6. The matrix of claim 4 further comprising an amplifier disposed in each of the output signal lines.

7. An internally redundant microwave switch matrix that provides for redundant fail-safe operation comprising:

a plurality of signal inputs;

a plurality of signal outputs;

a plurality of input signal lines respectively coupled between the plurality of signal inputs and a plurality of terminating resistors;

a plurality of output signal lines respectively coupled between the plurality of signal outputs and a plurality of terminating resistors;

a plurality of nodes wherein each node comprises an input line and a plurality of output lines, and a plurality of pairs of couplers that are respectively interconnected by way of respective switches that are used to select an input line and couple it to a respective output line;

and wherein pairs of output signal lines are connected to a single signal output.

8. The matrix of claim 7 wherein the nodes further comprise a second serially coupled switch connected between the input and output couplers to provide redundancy if either one of the switches fail in a closed state.

9. The matrix of claim 7 further comprising an amplifier disposed in each of the output signal lines.

* * * * *